(12) United States Patent
Savoj et al.

(10) Patent No.: US 11,294,443 B1
(45) Date of Patent: Apr. 5, 2022

(54) NOISE REDUCTION IN OSCILLATOR-BASED SENSOR CIRCUITS

(71) Applicant: Apple Inc., Cupertino, CA (US)

(72) Inventors: Jafar Savoj, Menlo Park, CA (US); Robert S. Brandt, II, Satellite Beach, CA (US); Bruno W. Garlepp, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/018,999

(22) Filed: Sep. 11, 2020

(51) Int. Cl.
| G06F 1/00 | (2006.01) |
| G06F 1/28 | (2006.01) |
| G06F 1/3296 | (2019.01) |
| G01R 19/00 | (2006.01) |
| G01K 7/00 | (2006.01) |

(52) U.S. Cl.
CPC ............... G06F 1/28 (2013.01); G01K 7/00 (2013.01); G01R 19/0046 (2013.01); G06F 1/3296 (2013.01)

(58) Field of Classification Search
CPC ...................................................... G06F 1/28
See application file for complete search history.

(56) References Cited

U.S. PATENT DOCUMENTS

| 6,353,749 B1 | 3/2002 | Siponen | |
| 7,113,011 B2 * | 9/2006 | Leung | H02M 3/33576 327/149 |
| 7,203,126 B2 | 4/2007 | Proebsting et al. | |
| 8,407,441 B2 * | 3/2013 | Giovannini | G11C 29/028 711/167 |
| 9,231,597 B2 | 1/2016 | Ippolito et al. | |
| 9,503,068 B1 * | 11/2016 | DiBene, II | G01R 19/04 |
| 10,386,189 B2 * | 8/2019 | Kushleyev | G05B 15/02 |
| 10,631,248 B2 | 4/2020 | Seshadri et al. | |
| 2014/0114593 A1 * | 4/2014 | Wu | G01R 31/3832 702/63 |
| 2019/0286772 A1 * | 9/2019 | Singh | G01R 31/318328 |
| 2020/0057465 A1 * | 2/2020 | Huang | G06F 1/08 |
| 2020/0235726 A1 * | 7/2020 | Naidorf | H03K 5/135 |

* cited by examiner

*Primary Examiner* — Mohammed H Rehman
(74) *Attorney, Agent, or Firm* — Kowert, Hood, Munyon, Rankin & Goetzel, P.C.

(57) ABSTRACT

A sensor circuit in a computer system measures a frequency of an oscillator circuit and uses the measured frequency to determine an operating condition of the computer system. The accuracy of the operating condition is limited by various sources of noise, including device noise, that introduce error into frequency measurements, limiting the accuracy to which the frequency of the oscillator signal may be measured. To improve the accuracy of the frequency measurement of the oscillator signal, the sensor circuit disables the oscillator between successive measurements, in order to reduce the correlation of error between the successive measurements. The sensor circuit combines the multiple measurement results to determine the frequency of the oscillator signal to a higher degree of accuracy, thereby improving the accuracy to which the operating condition is determined.

20 Claims, 9 Drawing Sheets

NOISE REDUCTION IN OSCILLATOR-BASED SENSOR CIRCUITS

BACKGROUND

Technical Field

This disclosure relates to sensor circuits in computer systems, and more particularly to reducing noise in sensor circuits for additional accuracy.

Description of the Related Art

Modern computer systems may perform certain tasks or operations in response to changes in the environments, in which the computer systems are located. For example, increases in operating temperature above a certain maximum in one or more of the computer system components may degrade the performance of, or damage, the computer system. This may require certain measures to be taken, such as changing the supply voltage, reducing the clock frequency, or other measures, in order to bring the temperature below the specified maximum in the affected components.

To react to changes in environment, a computer system may include multiple sensor circuits designed to detect various effects or situations. For example, such sensor circuits may include temperature sensors, acceleration sensors, ambient light sensors, and the like. The outputs of such sensor circuits may be polled by a processor or controller included in the computer system to determine what actions to perform.

Sensor circuits, such as those described above, may include any suitable combination of logic circuits, analog circuits, radio frequency circuits, and the like. In some cases, operating characteristics of the included circuits may be used to sense a desired environmental parameter.

SUMMARY OF THE EMBODIMENTS

Various embodiments of a sensor circuit are disclosed. A sensor circuit includes an oscillator circuit coupled to a power supply node, where the oscillator circuit is configured to generate an oscillator signal, and a control circuit that is configured to perform a measurement operation. To perform the measurement operation, the control circuit is further configured to enable the oscillator circuit for a plurality of active time periods, where successive active time periods are separated by an inactive time period during which the oscillator circuit is disabled, and measure, during the plurality of active time periods, a number of cycles in the oscillator signal to generate a plurality of cycle counts. The control circuit is further configured, in response to a completion of the measurement operation, to use the plurality of cycle counts to generate a result indicative of an operating condition associated with the oscillator circuit. In another embodiment, a change in the voltage level of the power supply node during a duration of the measurement operation is less than a threshold value.

Figure 1:
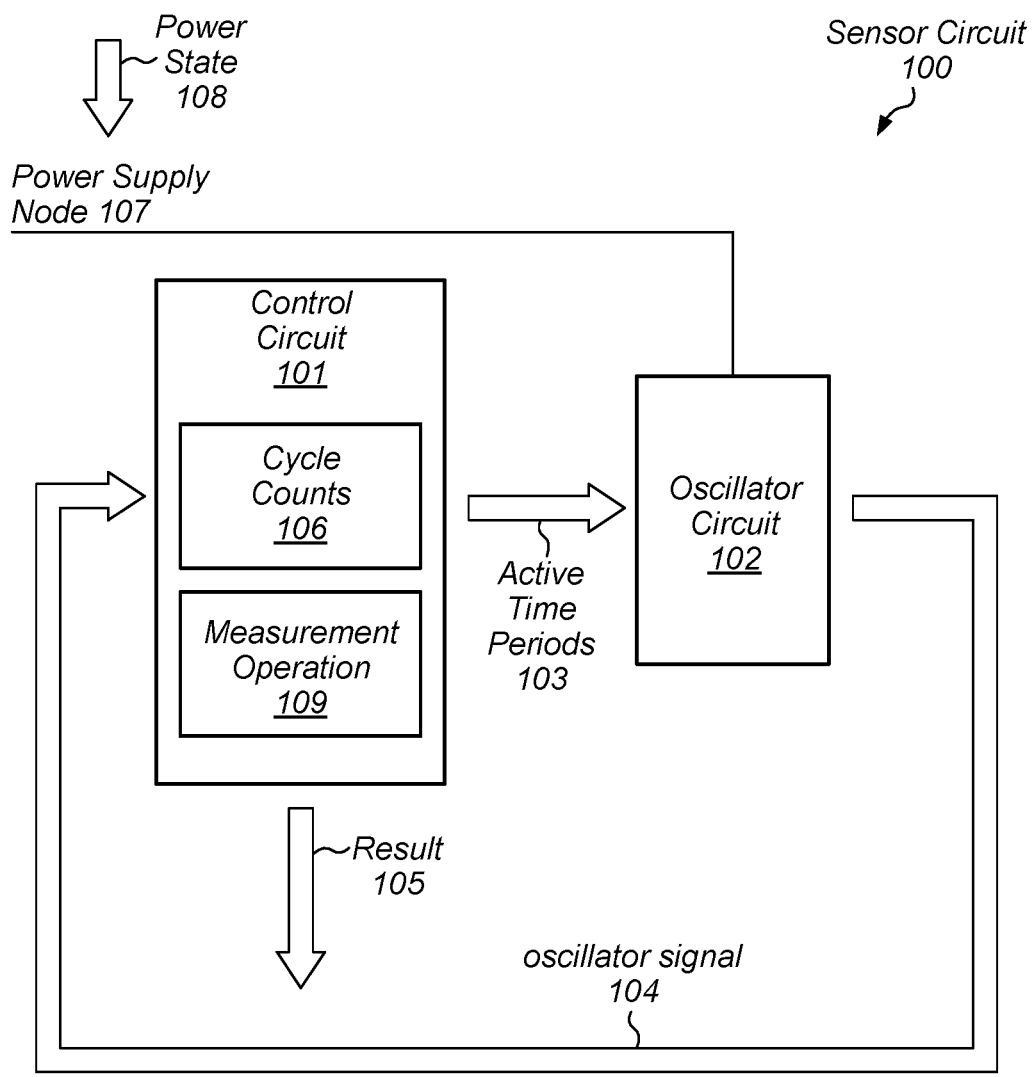
FIG. 1 is a block diagram of an embodiment of a sensor circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Many computer systems are equipped with various sensors that allow the detection of various effects and situations.

For example, some computer systems may include sensors for detecting ambient temperature, supply voltage, acceleration and deceleration, humidity, and the like.

Different techniques may be employed to detect various environmental and operating conditions. For example, oscillator circuits may be used to determine temperature and power supply voltage levels. Changes in temperature and the voltage level of a power supply can induce changes in a frequency of an oscillator signal generated by the oscillator circuit. Such changes in the frequency of the oscillator signal can be used to determine changes in temperature, power supply voltage level, and the like. The results of measuring the frequency of one or more oscillators at the same location can be combined with other factors to calculate the ambient temperature and supply voltage at the location in which these sensors are operating. The operating conditions that may be calculated using the average of ring oscillators are not limited to temperature and voltage.

In order to use the frequency of an oscillator signal to measure an operating condition, the frequency must be accurately measured. Various sources of noise within the oscillator circuit may affect the accuracy to which the frequency of the oscillator signal may be measured. Such sources of noise include reference clock jitter and device noise. Various techniques may be employed to reduce clock jitter; however, even if clock jitter noise could be reduced to zero, there is some amount of device noise in the oscillator circuit that is difficult to reduce or eliminate.

As used and defined herein, clock jitter (or simply "jitter") is a deviation of the oscillator signal rising and falling edges from their respective desired positions in time. Such deviations in the timing of the rising and falling edges can occur within a single cycle or from one cycle to another.

In addition to the aforementioned reference clock jitter, there is also jitter associated with an oscillator clock (referred to as "oscillator clock jitter"). One such source of oscillator clock jitter is device noise, which results from a combination of non-ideal physical phenomena (e.g., thermal noise, flicker noise, and the like) in the devices in the oscillator. Measurement of a frequency of the oscillator signal over many cycles can result in an accumulation of error in the measurement resulting from the sources of noise. Such an accumulation of error limits an accuracy to which the frequency of oscillator signal can be measured.

It may be understood that making frequency measurement over fewer cycles reduces an amount of accumulated error from oscillator clock jitter in the measured frequency. It may also be understood that by performing multiple frequency measurements and disabling (i.e., stopping) an oscillator circuit between measurements, a component of the error in the measured frequency that would normally be dependent on error from a previous measurement, becomes independent (i.e., uncorrelated) from one measurement to the next. Since the component of the error is uncorrelated between measurements, it can be treated as a random error that may be accounted for using statistical techniques (e.g., averaging) to more accurately determine the frequency of the oscillator signal. With the frequency of the oscillator signal being determined with a higher degree of accuracy, a more accurate determination of an operating condition (e.g., temperature) may also be achieved.

The embodiments illustrated in the drawings and described below provide techniques for operating an oscillator-based sensor circuit in which the oscillator circuit is stopped between measurement periods to reduce device noise correlation between measurements, thereby improving the accuracy of a measurement of a signal generated by the oscillator circuit.

A block diagram of a sensor circuit is depicted in FIG. 1. As illustrated, sensor circuit 100 includes control circuit 101, and oscillator circuit 102.

Oscillator circuit 102 is coupled to power supply node 107 and is configured to generate oscillator signal 104. As described below in more detail, oscillator circuit 102 may be a ring oscillator circuit that may include any suitable number of inverters or other logic circuits. It is noted that although only a single oscillator circuit is depicted in the embodiment of FIG. 1, in other embodiments, multiple oscillator circuits may be employed to detect multiple operating conditions.

Control circuit 101 is configured to perform measurement operation 109. In various embodiments, the performance of measurement operation 109 may be triggered in response to receiving a request from a controller or other similar circuit. In other embodiments, measurement operation 109 may be performed at periodic intervals or in responses to changes power state 108 or other changes in the operating conditions of sensor circuit 100.

To perform measurement operation 109, control circuit 101 is further configured to enable oscillator circuit 102 for active time periods 103, and measure, during active time periods 103, a number of cycles in oscillator circuit 102 to generate cycle counts 106. In various embodiments, successive active time periods of active time periods 103 are separated by an inactive time period, during which oscillator circuit 102 is disabled.

As used herein, a "power state" refers to a particular combination of operating conditions for an integrated circuit that allow a given performance for a particular power consumption. Power states may be defined as part of a specification of the integrated circuit, and may conform with various power management standards in some embodiments. To manage power consumption of an integrated circuit, the power state may be changed based on changes in an amount of work the integrated circuit is performing.

In some cases, a power state change results in a change in the voltage level of power supply node 107, which may affect a frequency of oscillator signal 104. If measurement operation 109 is performed during such a change in the voltage level of power supply node 107, some of cycle counts 106 may correspond to one voltage level and others of cycle counts 106 may correspond to another voltage level. Since the voltage level of power supply node 107 affects the frequency of oscillator signal 104, the different ones of cycle counts 106 cannot be used together to determine the frequency of oscillator signal 104. To compensate for this problem, the duration of measurement operation 109 is kept short relative to changes in the voltage level of power supply node 107, such that a change in the voltage level of power supply node 107 during the duration of measurement operation 109 is less than a threshold value. Such a threshold value may be selected based on a sensitivity of oscillator signal 104 to changes in supply voltage. For example, in some cases, the threshold value may be selected to be tens of millivolts. By keeping the duration of measurement operation 109 short enough such that changes in the voltage level of power supply node 107 are less than the threshold value, variation in the frequency of oscillator signal 104 resulting from power supply voltage changes may be minimized.

Additionally, control circuit 101 is further configured to use cycle counts 106 to generate a result 105, which is indicative of an operating condition associated with the oscillator circuit 102. For example, in some embodiments, cycle counts 106 may be used to determine a temperature of oscillator circuit 102. As described below in more detail, control circuit 101 may be coupled to a communication bus in some embodiments, which may allow result 105 to be communicated with other sensor circuits, a controller for a computer system, or other circuitry.

Figure 2:
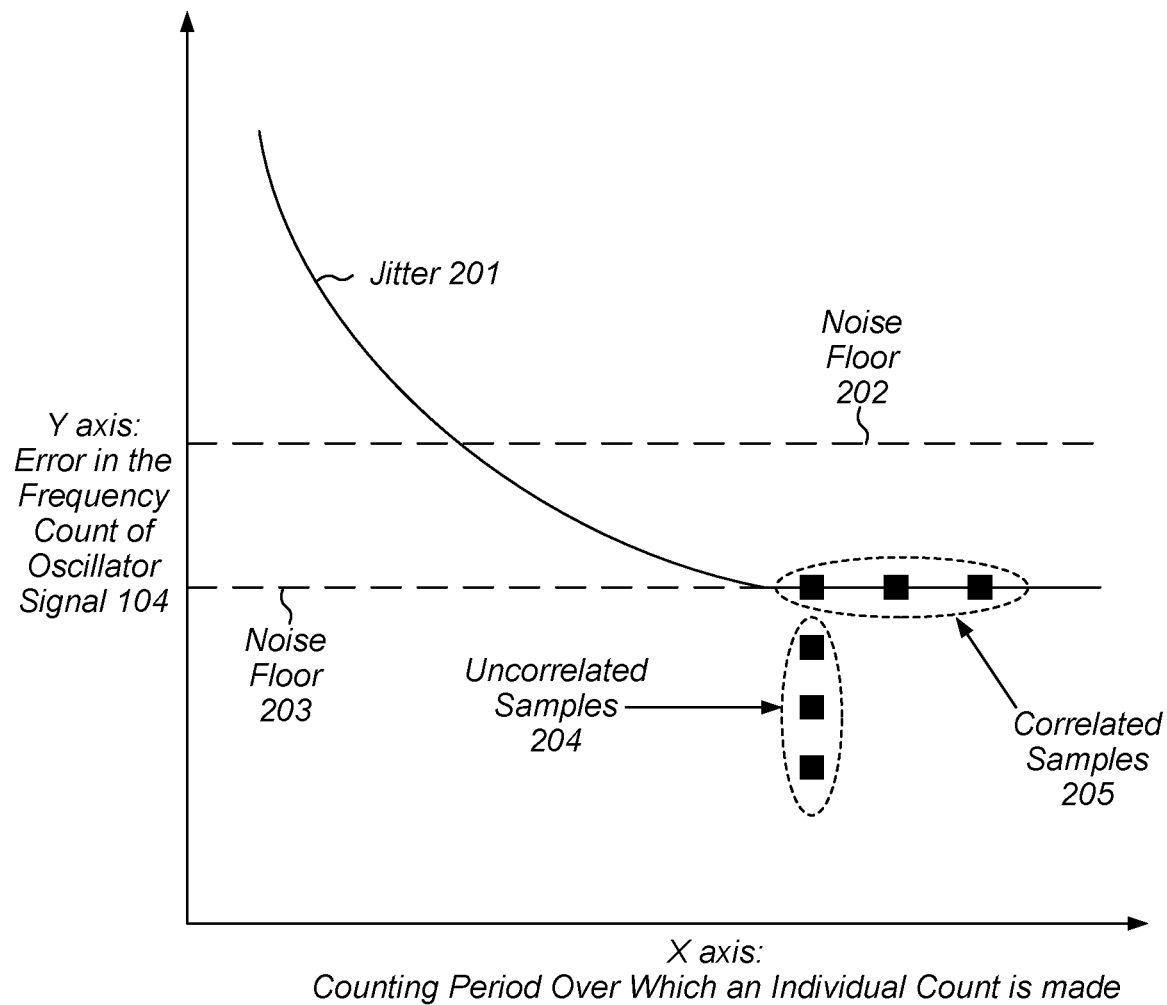
FIG. 2 depicts a chart illustrating the effects of device noise in measuring jitter in an oscillator signal.

FIG. 2 depicts a chart illustrating the effect of device noise on the accuracy of measurements of oscillator signal 104 by showing a phase noise profile at a given frequency. There are various sources of noise (e.g., devices in the oscillator circuit 102), which limit the accuracy of sample measurements of the frequency of the oscillator signal by control circuit 101.

As described below, oscillator circuit 102 may be implemented according to various design methodologies. In some cases, oscillator circuit 102 may include multiple metal-oxide semiconductor field-effect transistors (MOSFETs), or other suitable transconductance devices.

As described above, there are several sources of device noise, including 1/f (referred to as "flicker noise"), channel thermal noise, resistive poly gate thermal noise, shot noise, popcorn noise, and the like. Flicker noise is the dominant noise source at lower phase noise offset frequencies. As the phase noise offset frequency increases, flicker noise decreases, so that at higher frequencies, flicker noise is not a significant factor, and other noise sources become dominant. At frequency offsets at which other noise sources become dominant, the combination of the other noise sources causes a minimum noise level (referred to as a "noise floor"). The noise floor is constant across frequencies above which flicker noise is not a significant factor.

The graph of FIG. 2 depicts an error in the frequency count of oscillator signal 104 on the Y axis and the counting period over which an individual count is made on the X axis. The curve labeled as jitter 201 represents the measured jitter associated with oscillator signal 104 using conventional frequency measurement techniques. Noise floors 202 and 203 represent the noise floors for respective semiconductor manufacturing processes with different physical characteristics (e.g. different transistor channel lengths). It is noted that jitter 201 indicates that error count tends to become flat along noise floor 203.

Conventional measurement of a frequency of the oscillator signal includes counting edges of the oscillator signal over some period of time. As shown by jitter 201, this technique results in a decrease in the count error as the sampling period increases. At some point, however, further reductions in count error is limited by various factors (e.g. flicker noise), which, in turn, limits the accuracy of the frequency measurement of oscillator signal 104. For example, as the sampling period increases, correlated samples 205 lie along noise floor 203, limiting any further increase in the accuracy of the measurement of the frequency of oscillator signal 104.

This problem is further exacerbated as geometries in semiconductor manufacturing process technology shrink. As illustrated, noise floor 202 corresponds to a semiconductor manufacturing process with smaller geometries than the semiconductor manufacturing process associated with noise floor 203. It is noted that in some cases, noise floor 202 may be as much as five times greater than noise floor 203. With such an increase in the level of the noise floor, the accuracy of the measurement of the frequency of an oscillator signal is likewise limited.

It may be understood that when measuring oscillator signal 104 over many sample periods, the cumulative error of both oscillator signal 104 as well as reference (or sampling) clock signal contribute to the limit a reduction in the error count to the noise floor. It may also be understood that disabling the oscillator between frequency measurements, and accumulating the different measurement results from multiple measurement periods reduces the accumulation of errors from oscillator signal 104 and the sampling clock signal, allowing the individual frequency measurements to be treated as uncorrelated. For example, as depicted by FIG. 2 uncorrelated samples 204, correspond to a case where oscillator circuit 102 is disabled between measurements. As depicted in FIG. 2, uncorrelated samples 204 are associated with lower error counts, which result in a more accurate measurement of the frequency of oscillator signal 104. In some cases, statistical processing (e.g., averaging) may be applied to uncorrelated samples 204 to further improve the accuracy of the measurement of the frequency of oscillator signal 104.

Figure 3:
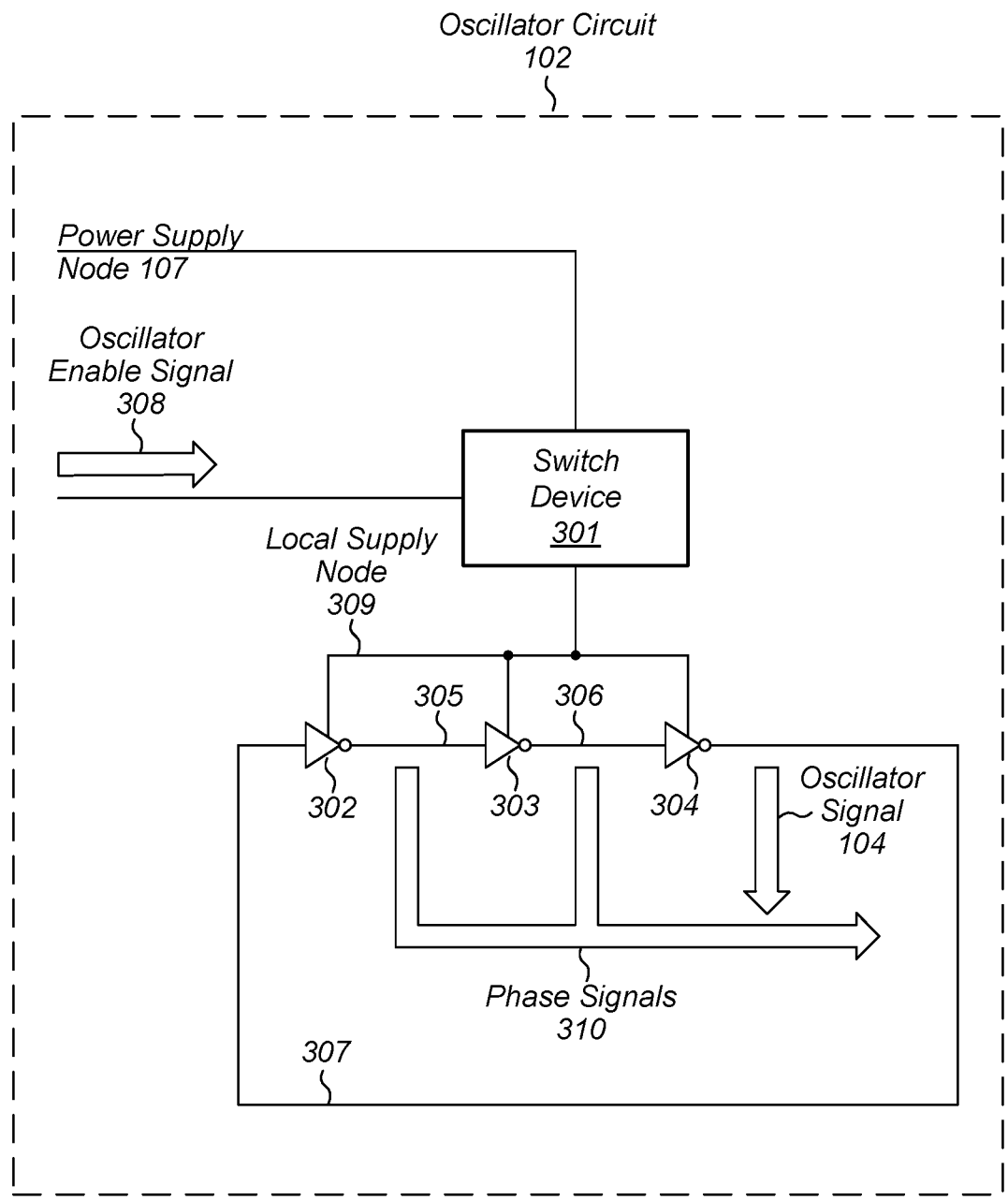
FIG. 3 illustrates a block diagram of an embodiment of an oscillator circuit.

Turning to FIG. 3, a block diagram of an embodiment of oscillator circuit 102 is depicted. As illustrated, oscillator circuit 102 is implemented as a ring oscillator circuit that includes switch device 301, and inverters 302, 303, and 304. Although three inverters are depicted in the embodiment of FIG. 3, in other embodiments, any suitable number of inverters may be employed.

As used and described herein, asserting a signal refers to setting the signal to a particular value that activates a device or circuit coupled to the signal. In a similar fashion, de-asserting a signal refers to setting the signal to a different value that de-activates the device or circuit coupled to the signal.

Switch device 301 is coupled between power supply node 107 and local supply node 309. In various embodiments, switch device 301 is configured to selectively couple local supply node 309 to power supply node 107 based on oscillator enable signal 308. For example, when oscillator enable signal 308 is asserted, switch device 301 couples local supply node 309 to power supply node 107, thereby allowing a voltage level of local supply node 309 to be substantially the same as a voltage level of power supply node 107. Alternatively, when oscillator enable signal 308 is de-asserted, switch device 301 may open, thereby de-coupling local supply node 309 from power supply node 107.

Switch device 301 may be implemented according to various design methodologies. In some cases, switch device 301 may include multiple metal-oxide semiconductor field-effect transistors (MOSFETs), or other suitable transconductance devices, configured to selectively couple local supply node 309 to power supply node 107 using oscillator enable signal 308.

Inverters 302, 303, and 304 are coupled to local supply node 309 and are arranged in a ring topology in the depicted embodiment. Due to the odd number of inversions around the ring, oscillator circuit 102 generates multiple time-varying signals, each of which have similar frequencies, but are phase shifted from one another. Due to the phase shifts, the time-varying signals are denoted as phase signals 310. In some cases, two or more of phase signals 310 may be employed in sensor circuit 100 may employed to improve the resolution of the frequency measurement, which, in turn, may improve the accuracy with which the operating parameter (e.g., temperature) is determine. In other cases, a given one of phase signals 310, denoted as oscillator signal 104, may be used in sensor circuit 100. The respective frequencies of phase signals 310 are a function of respective delays associated with inverters 302, 303, and 304, a voltage level of local supply node 309, a temperature of oscillator circuit 102, as well other factors. Inverter 302 is coupled between nodes 307 and 305, and is configured to invert the logical state of a signal on node 307 to generate a signal on node 305. Inverter 303 is coupled between nodes 305 and 306, and is configured to invert the logical state of a signal on node 305 to generate a signal on node 306. In a similar fashion, inverter 304 is coupled between nodes 306 and 307, and is configured to invert the logical state of a signal on node 306 to generate a signal on node 307, namely oscillator signal 104.

As noted above, the respective frequencies of phase signals 310 may vary based on various conditions. For example, the respective frequencies of phase signals 310 may increase in response to an increase in a voltage level of local supply node 309. As described above, switch device 301 may de-couple local supply node 309 from power supply node 107, allowing the voltage level of local supply node 309 to decay. When this occurs, the respective frequencies of phase signal 310 may decrease, and may stop entirely, thus disabling oscillator circuit 102.

It is noted that inverters, such as those shown and described herein, may be complementary metal-oxide semiconductor (CMOS) inverting amplifiers in some embodiments. In other embodiments, however, any suitable configuration of inverting amplifier that is capable of inverting the logical state of a signal may be used, including inverting amplifiers built using technology other than CMOS.

As described above, control circuit 101 uses cycle counts 106 to generate result 105. Various techniques may be used to determine cycle counts 106 and generate result 105. One technique involves the use of counter and accumulator circuits. An embodiment of control circuit 101 that makes use of such circuits is depicted in FIG. 4.

Figure 4:
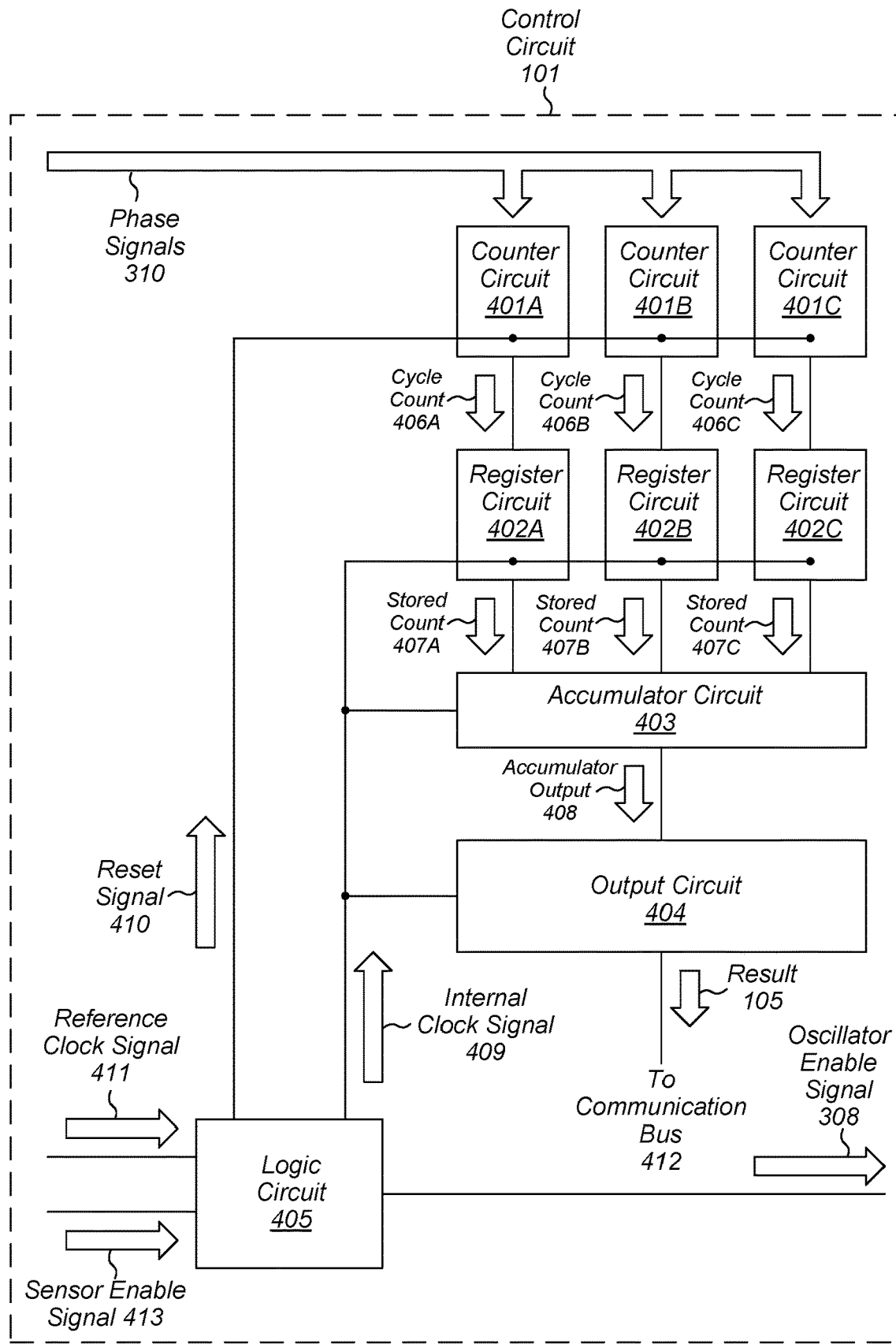
FIG. 4 illustrates a block diagram of an embodiment of a control circuit used in a sensor circuit.

Turning to FIG. 4, a block diagram of one embodiment of control circuit 101 is depicted. As shown, control circuit 101 includes counter circuits 401A, 401B, and 401C, register circuits 402A-402C, accumulator circuit 403, logic circuit 405, and output circuit 404. It is noted that although three counter circuits and three register circuits are depicted in this embodiment of control circuit 101, in other embodiments any suitable number of counter circuits and register circuits may be employed. In some embodiments, the number of counter and register circuits may be based on a number of phase signals included in phase signals 310.

It is noted that counter circuits 401A-C may be implemented according to a variety of circuit design techniques. For example, in order to save power or circuit area, a single counter may be employed to count a particular one of phase signals 310. In other cases, counter circuits 401A-C may include one integer counter circuit connected to a corresponding one of phase signals 310, and fractional counter circuits connected to the remaining phase signals of phase signals 310. Such an approach may maintain a desired level of accuracy while limiting hardware complexity.

Counter circuits 401A, 401B, and 401C are configured to count the number of cycles of respective ones of phase signals 310 that occur during ones of active time periods 103 in order to generate cycle counts 406A, 406B, and 406C. In various embodiments, counter circuits 401A, 401B, and 401C may be a sequential logic circuit configured to transition between multiple different logic states that correspond to various values of cycle counts 406A, 406B, and 406C. At the end of a given one of active time periods 103, counter circuits 401A, 401B, and 401C are reset to a particular value (e.g., zero), in response to an assertion of reset signal 410. Counter circuits 401A, 401B, and 401C are reset so that they are ready to begin counting cycles at the start of a next one of active time periods 103.

Register circuits 402A, 402B, and 402C are configured, at the start of an inactive period of oscillator circuit 102 (as indicated by internal clock signal 409), to store respective values of cycle counts 406A, 406B, and 406C. In some embodiments, register circuits 402A, 402B, and 402C may include any suitable number of latch circuits, flip-flop circuits, or other suitable storage circuit. In some cases, a number of storage circuits included in a given one of register circuits 402A-402C may be based on a number of bits included in a corresponding one of cycle counts 405A-405C.

Accumulator circuit 403 is configured to load the cycle counts retained by register circuits 402A, 402B, and 402C (as indicated by stored counts 407A, 407B, and 407C), and to combine these cycle counts for a number of successive active time periods.

Accumulator circuit 403 is further configured to generate accumulator output 408 from this combination of successive cycle counts. In various embodiments, accumulator circuit 403 may include one or more adder circuits or any other suitable circuit configured to combine the values of cycle counts 406A, 406B, and 406C stored in register circuits 402A, 402B, and 402C. In some cases, accumulator circuit 403 may include additional register circuits configured to store intermediate results generated during the combination operation.

Output circuit 404 is configured to generate result 105 using accumulator output 408. To generate result 105, output circuit 404 may, in some embodiments, be configured to calculate a temperature of oscillator circuit 102 using accumulator output 408.

In various embodiments, output circuit 404 is configured to transmit data indicative of result 105 on communication bus 412. It is noted that in some cases, output circuit 404 may transmit data indicative of accumulator output 408 without performing a calculation to determine temperature, voltage level of power supply node 107, or the like.

Logic circuit 405 is configured to generate, using reference clock signal 411 and sensor enable signal 413, reset signal 410, internal clock signal 409, and oscillator enable signal 308. In various embodiments, logic circuit 405 may be a sequential logic circuit configured to step through a series of logic states, using reference clock signal 411 to trigger a transition from one logic state to another. In some cases, the series of logic states may correspond to different regimes of operation. For example, one logic state may correspond to an inactive period of oscillator circuit 102, while another logic state may correspond to an active period of oscillator circuit 102.

Logic circuit 405 is further configured to generate internal clock signal 409 based on reference clock signal 411. In various embodiments, logic circuit 405 may include multiple inverter circuits, buffer circuits, delay chain circuits, or any other suitable types of circuits to generate internal clock signal 409 with a desired phase and/or frequency relationship to reference clock signal 411. For example, in some cases, logic circuit 405 may generate internal clock signal 409 such that a frequency of internal clock signal 409 is greater than or less than a frequency of reference clock signal 411. In various embodiments, a frequency of internal clock signal 409 may be based on a range of frequencies associated with respective ones of phase signals 310.

Logic circuit 405 is further configured to reset, during inactive time periods prior to the start of the next active time period, the cycle count values in the counter circuits 401A, 401B, and 401C and the register circuits 402A, 402B, and 402C, to zero or any other suitable value, to prepare them for the following active time period cycle counts. Accumulator circuit 403 may be configured to retain cycle counts, from a succession of active time periods, and may not be reset during every active time period so that count values may be accumulated during an entire measurement period. As noted above, using cycle count values across multiple active time periods where oscillator circuit 102 has been disabled between any two of the time periods, removes device noise correlation and improves accuracy of the measurement of the frequency of oscillator circuit 102.

Figure 5:
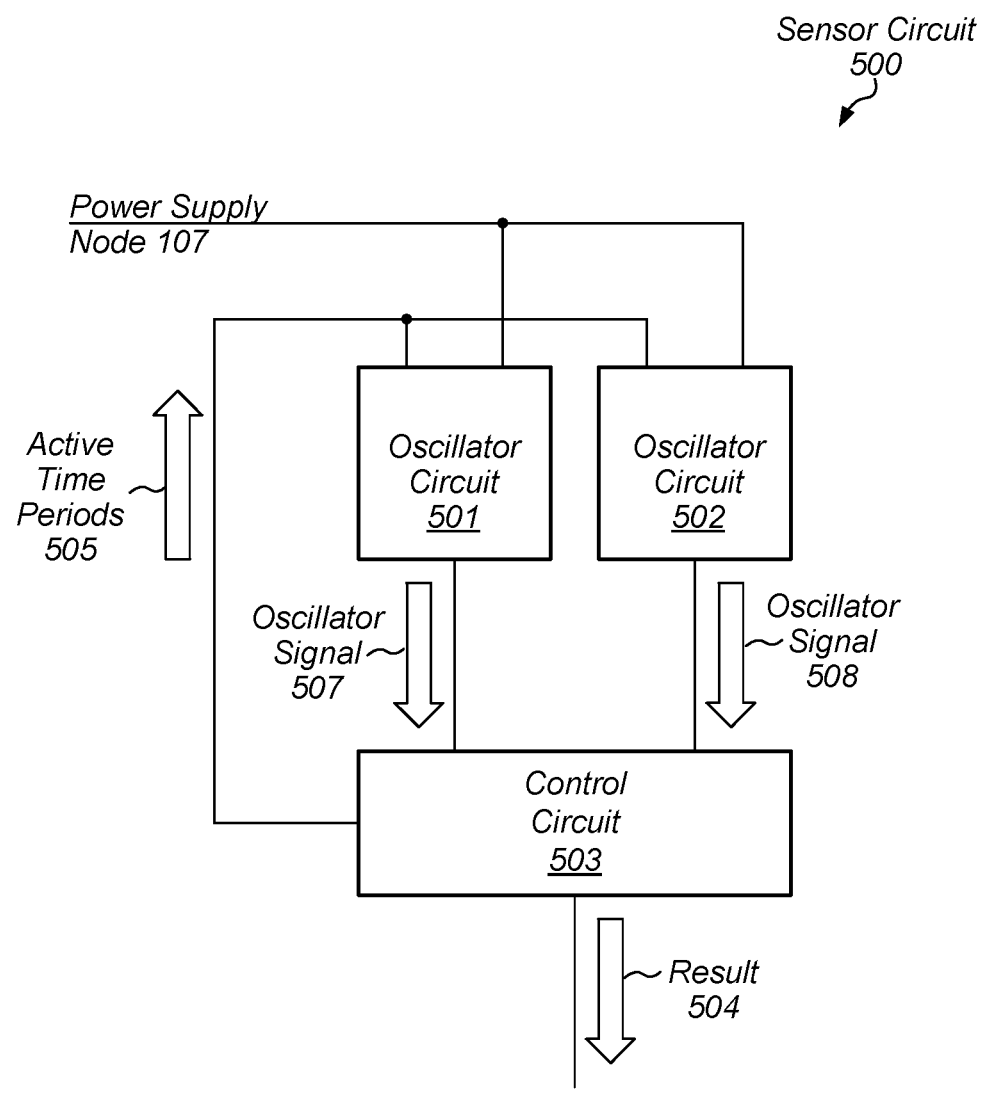
FIG. 5 illustrates a block diagram of another embodiment of a sensor circuit.

In some cases, a sensor circuit may be configured to measure more than one operating condition. A block diagram of another embodiment of a sensor circuit that is configured to measure more than one operating condition is depicted in FIG. 5. As illustrated, sensor circuit 500 includes a control circuit 503, and two oscillator circuits 501 and 502. It is noted that although two oscillator circuits are depicted in the embodiment of FIG. 5, in other embodiments, any suitable number of oscillator circuits may be employed to measure multiple operating conditions.

Oscillator circuits 501 and 502 are coupled to power supply node 107, and are configured to generate oscillator signal 507 and oscillator signal 508, respectively. In various embodiments, oscillator circuits 501 and 502 may be ring oscillator circuits, while in other embodiments, oscillator circuits 501 and 502 may employ other oscillator circuit topologies. It is noted that sensor circuit that employ two or more oscillator circuits, the different oscillator circuits may be configured to operate in different manners that may be suitable for detecting different types of operating conditions.

Control circuit 503 is configured to enable oscillator circuits 501 and 502 for active time periods 505. As with the embodiment depicted in FIG. 1, any two successive time periods of active time periods 505 are separated by inactive time periods, during which oscillators circuits 501 and 502 are disabled. In some cases, a duration of active time periods 505 is less than a time between changes in a voltage level of power supply node 107 resulting from a change in power state.

In various embodiments, the duration of the active time periods and the disabled time periods may differ for the different oscillator circuits. In some cases, the differing time periods may be based on respective operation conditions to be detected being suitable for detecting different types of sensor circuit operating conditions. For example, in some cases low frequencies of oscillator signals 507 and 508 may employ longer time periods in order to count a sufficient number of cycles to maintain a desired level of accuracy in the measure of the respective frequencies of oscillators signals 507 and 508.

Control circuit 503 is further configured to measure, during active time periods 505, numbers of cycles in the oscillator signals 507 and 508 in order to generate respective cycle counts (not shown). Additionally, control circuit 503 is configured to use the cycle counts from oscillator circuits 501 and 502, to generate a result 504. In various embodiments, control circuit 503 may correspond to control circuit 101, or may include similar sub-circuit blocks to control circuit 101.

In various embodiments. result 504 may be indicative of at least one operating condition associated with sensor circuit 500. Since sensor circuit 500 includes two oscillator circuits, control circuit 503 may be configured to generate result 504 such that it is indicative of two operating conditions associated with sensor circuit 500. For example, control circuit 503 may be configured to generate result 504 that includes information indicative of a temperature of sensor circuit 500 as well as a voltage level of power supply node 107.

Figure 6:
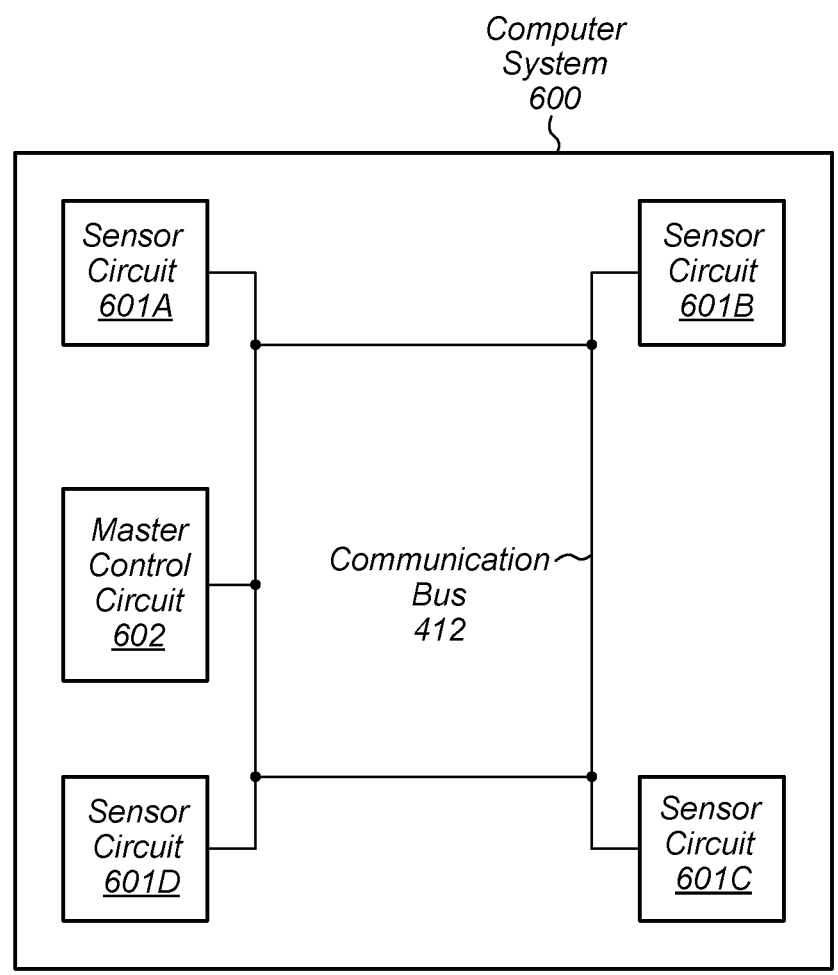
FIG. 6 illustrates a block diagram depicting an embodiment of a computer system using multiple sensor circuits.

In some computer systems, multiple sensor circuits may be employed to gather information from various regions within a computer system. A block diagram of such a computer system is depicted in FIG. 6. As illustrated, computer system 600 includes sensor circuits 601A, 601B, 601C, and 601D, and master control circuit 602, all coupled to one another via communications bus 412 In some embodiments, computer system 600 may be an integrated circuit with sensor circuits 601A, 601B, 601C, and 601D placed at different locations on the integrated circuit. It is noted that the connections between sensor circuits 601A-D depicted in FIG. 6 are merely an example. In other embodiments, different connection topologies (e.g., a ring topology) for sensor circuits 601A-D are possible and contemplated.

In various embodiments, sensor circuits 601A, 601B, 601C, and 601D and master control circuit 602 are coupled together in a daisy chain fashion using communications bus 412. A given sensor circuit of sensor circuits 601A, 601B, 601C, and 601D may be configured to transmit, via communication bus 412, data indicative of one or more operating conditions associated with the given sensor circuit to master control circuit 602. In various embodiments, the data may consist of an averaged cycle count, a calculated ambient temperature at the locations of the given sensor circuit, the calculated power supply voltage at the location of the given sensor circuit, or other data indicative of an operating condition at the location of the given sensor circuit.

In various embodiments, master control circuit 602 may be configured to adjust an operating parameter of computer system 600 using data from any one of sensor circuits 601A, 601B, 601C, and 601D. For example, master control circuit 602 may be configured to reduce a voltage level of a power supply node, decrease a frequency of a clock signal, or any other suitable operation, in response to a determination that an operation condition measured by sensor circuits 601A, 601B, 601C, and 601D has exceed a threshold value. Master control circuit 602 may be a state machine or other sequential logic circuit. Alternatively, master control circuit 602 may be implemented as a general-purpose processor circuit configured to execute software or program instructions to adjust the operating parameter of computer system 600.

Data may be transmitted over communication bus 412 in numerous ways. In various embodiments, communication bus 412 may employ one of various communication protocols, for example, the IEEE 1500 protocol. In addition to data, communications bus 412 may be further configured to carry a clock signal (e.g., reference clock signal 411), a control signal, or any other signals to sensor circuits 601A, 601B, 601C, and 601D. For example, master control circuit 502 may transmit an enable signal to sensor circuits 601A, 601B, 601C, and 601D that selectively enables or disables particular ones of sensor circuits 601A-601D.

It is noted that although the embodiment depicted in FIG. 6 includes four sensor circuits, in other embodiments any suitable number of sensor circuits may be located at respective locations on within computer system 600.

Figure 7:
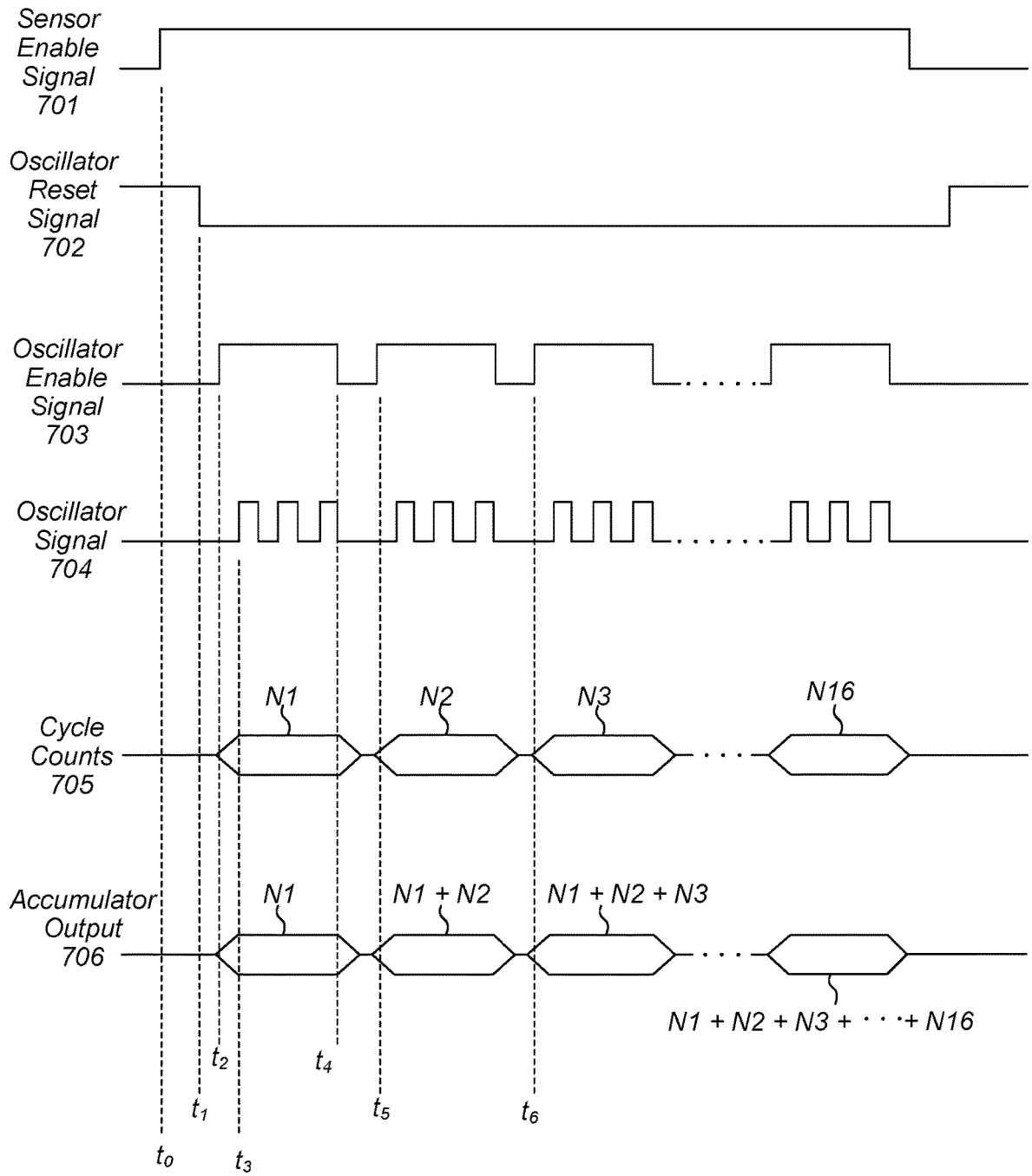
FIG. 7 depicts example waveforms associated with the operation of a sensor circuit.

Turning to FIG. 7, example waveforms associated with the operation of an embodiment of sensor circuit 100 are illustrated. In various embodiments, the waveforms of FIG. 7 may correspond to the signals of FIGS. 1, 3, and 4, as described herein. For example, oscillator enable signal 703 may correspond to oscillator enable signal 308, oscillator signal 704 may correspond to oscillator signal 104, cycle counts 705 may correspond to cycle counts 406A, B, and C, accumulator output 706 may correspond to the accumulator output 408, and sensor enable signal 701 may correspond to sensor enable signal 413.

This description of an embodiment of sensor circuit 100 timing refers to time labels at the bottom of FIG. 7. Prior to time t0, sensor enable signal 701 is de-asserted, as defined above, i.e. sensor enable signal 701 is at a low logic value, disabling sensor circuit 100. At time t0, sensor enable signal 701 is asserted, i.e., sensor enable signal 701 transitioned from a low logic value to a high logic value, thereby enabling sensor circuit 100. During the time interval between time t0 and t1, sensor enable signal 701 is asserted, while oscillator reset signal 702 remains asserted. Therefore, between times t0 and t1, control circuit 101 is enabled, but oscillator circuit 102 remains disabled. At time t1, oscillator reset signal 702 is transitions to a low logic value, allowing oscillator circuit 102 to generate oscillator signal 704 when oscillator enable signal 703 is asserted at time t2.

As used herein, a low logic value (also referred to as a "logical-0") corresponds to a voltage level sufficient to activate a p-channel MOSFET, and a high logic vale (also referred to as a "logical-1") corresponds to a voltage level sufficient to activate an n-channel MOSFET. It is noted that in technologies other than CMOS, a low logic value and a high logic value may correspond to different voltage levels.

At time t2, oscillator enable signal 703 is asserted, thereby enabling oscillator circuit 102 as described above. Furthermore, at time t2, a counter circuit (e.g., counter circuits 401A-C), begins to count a number of cycles of oscillator signal 704. Cycle counts 705 depict a number of counted cycles of oscillator signal 704.

When oscillator enable signal 703 is de-asserted at time t4, cycle counts 705 has a value N1, which corresponds to a number of oscillator signal 704 cycles that were counted during the time interval from time t2 to t4. Cycle counts 705 value N1 is included in accumulator output 706. As noted above, cycle counts 705 may be stored in an accumulator circuit (e.g., accumulator circuit 403) whose value may correspond to accumulator output 706. In some embodiments, count value N1 may be stored in a register prior to being stored in an accumulator circuit.

Between times t4 and t5, oscillator enable signal 703 is de-asserted, disabling oscillator circuit 102 as described above. During this time period, the counter may be stopped (or "frozen") to maintain its current value.

The time interval between t2 and t4, in which oscillator enable signal 703 is asserted, oscillator circuit 102 is enabled, and the number of cycle counts 705 is being counted, is referred to herein as an "active time period", which may correspond to active time periods 103. The time between time t4 and t5 in which oscillator enable signal 703 is de-asserted, during which time, oscillator circuit 102 is disabled, and during which the counter may be frozen to maintain its value, is referred to herein as an "inactive time period."

As described above, successive active time periods are separated by an inactive time period. Disabling oscillator circuit 102 between active time periods may improve an accuracy of a measurement of cycle counts 705 during an active time period.

A duration of time between times t2 and t5 constitutes a portion of the duration of measurement operation 109. As described above, measurement operation 109 includes multiple cycles of one active time period followed by one inactive time period.

During successive cycles of active and inactive time periods, the resultant values of cycle counts 705 counted during the active time periods, are combined, as depicted by accumulator output 706. For example, during the first active time period between time t2 and t5, cycle counts 705 value N1 is stored to the accumulator, then during the second active time period between time t5 and t6, the accumulator stores N1 and N2, and so on, until measurement operation 109 ends.

For the duration of measurement operation 109, additional cycle counts 705 values are combined with previous cycle counts as shown in accumulator output 706. Measurement operation 109 continues as long as sensor enable signal 701 remains asserted and oscillator reset signal 702 remains de-asserted. While measurement operation 109 continues, oscillator enable signal 703 continues to be asserted and de-asserted so as to continue successive cycles of active and inactive time periods.

Measurement operation 109 may continue until accumulator circuit 403 has stored a sufficient number of cycle counts 705, as illustrated in accumulator output 706, for output circuit 404 to employ to determine an operating condition such as ambient temperature, supply voltage level, and the like, at the location in which the sensor is operating.

Figure 8:
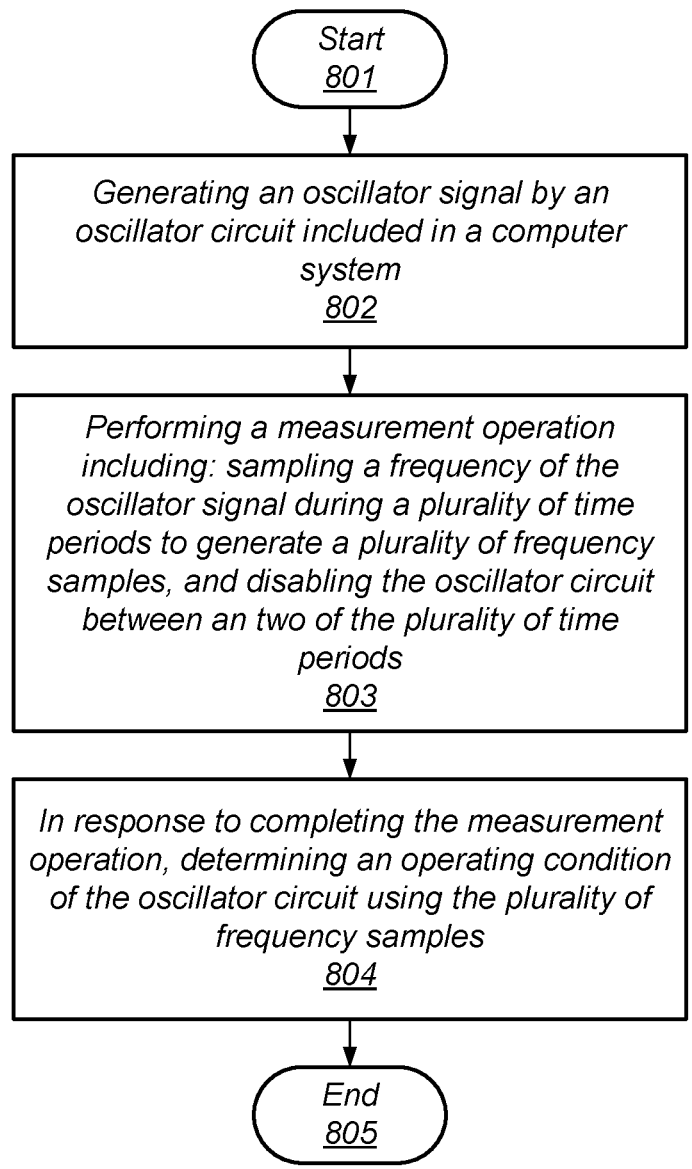
FIG. 8 illustrates a flow diagram depicting an embodiment of a method for operating a sensor circuit.

Turning to FIG. 8, a flow diagram depicting an embodiment of a method for operating a sensor circuit is illustrated. The method, which may be applied to either sensor circuit 100 or sensor circuit 500, begins in block 801.

The method includes generating an oscillator signal by an oscillator circuit included in a computer system (block 802). In various embodiments, generating the oscillator signal may include performing an odd number of logical inversions of a signal using multiple inverters coupled together in a daisy chain fashion.

The method further includes performing a measurement operation including: sampling a frequency of the oscillator signal during a plurality of the time periods to generate a plurality of active periods to generate a plurality of frequency samples and disabling the oscillator circuit between any two of the plurality of time periods (block 803). In some embodiments, sampling the frequency of the oscillator signal includes counting a number of cycles included in the oscillator signal during a given time period of the plurality of time periods. In some cases, counting the number of cycles includes incrementing at least one counter circuit (e.g., one of counter circuits 401A, 401B, and 401C) in response to detecting a rising or falling edge of oscillator signal. In some embodiments, the method also includes storing the number of cycles, in response to determining that the given time period has elapsed, and resetting a count associated with the number of cycles prior to a start of a different time period subsequent to the given time period.

In various embodiments, a duration of the measurement operation is less than a time between changes in power state of the computer system. In some embodiments, disabling the oscillator circuit includes decoupling the oscillator circuit from a power supply node.

The method also includes determining an operating condition of the oscillator circuit using the plurality of frequency samples, which further includes combining at least a first number of cycles measured during a first time period and a second number of cycles measured during a second time period of the plurality of time periods, and which further includes calculating the a sum (or an "accumulation") of the first number of cycles and the second number of cycles (804).

In various embodiments, determining the operating condition of the oscillator circuit includes determining a temperature of the oscillator circuit. In other embodiments, determining the operating condition of the oscillator circuit includes determining a voltage level of a power supply coupled to the oscillator circuit. The method concludes in block 805.

Figure 9:
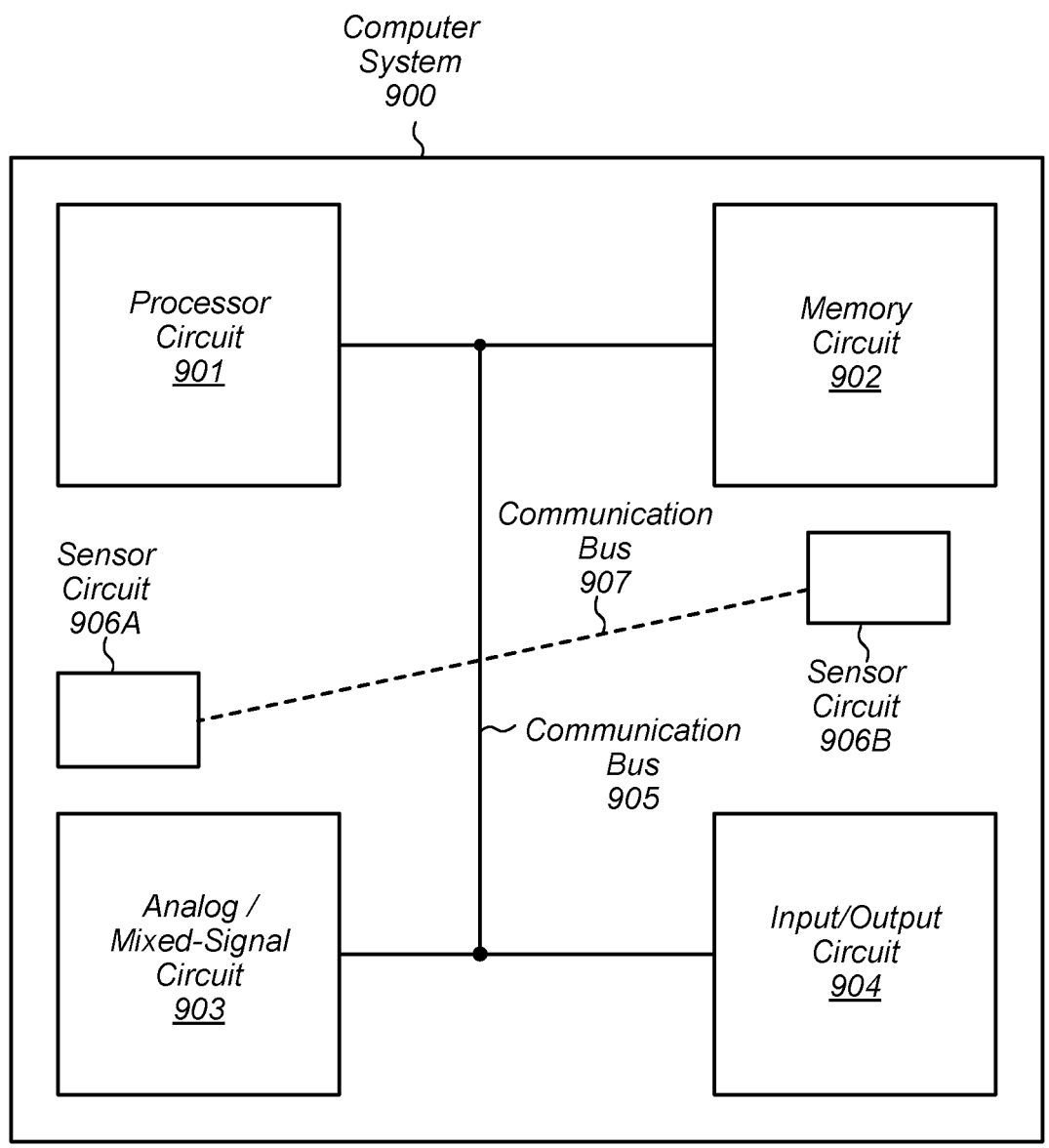
FIG. 9 illustrates a block diagram of a computer system that includes sensor circuit.

A block diagram of computer system is illustrated in FIG. 9. As illustrated in this embodiment, the computer system 900 includes processor circuit 901, memory circuit 902, analog/mixed-signal circuit 903, input/output circuit 904, and sensor circuits 906A and 906B. Each of processor circuit 901, memory circuit 902, analog/mixed-signal circuit 903, and input/output circuit 904 is coupled to communication bus 905, while sensor circuits 906A and 906B are coupled to one another via communication bus 907. It is noted that in some embodiments, communication bus 907 may correspond to communication bus 412 are depicted in FIG. 4, and that sensor circuits 906A and 906B may correspond to sensor circuit 100 as depicted in FIG. 1 In various embodiments, computer system 900 may be a system-on-a-chip (SoC) and be configured for use in a desktop computer, server, or in a mobile computing application such as, a tablet, laptop computer, or wearable computing device.

Processor circuit 901 may, in various embodiments, be representative of a general-purpose processor that performs computational operations. For example, processor circuit 901 may be a central processing unit (CPU) such as a microprocessor, a microcontroller, an application-specific integrated circuit (ASIC), or a field-programmable gate array (FPGA).

Memory circuit 902 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 9, a single memory circuit is depicted. In other embodiments, any suitable number of memory circuits may be employed.

Analog/mixed-signal circuits 903 may include various analog or mixed signal circuits, such as a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 903 may be configured to perform power management tasks with the inclusion of on-chip power supplies and voltage regulators.

Input/output circuits 904 may be configured to coordinate data transfer between computer system 900 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 904 may be configured to implement a version of Universal Serial Bus (USB) protocol or IEEE 1394 (Firewire®) protocol.

Input/output circuits 904 may also be configured to coordinate data transfer between computer system 900 and one or more devices (e.g., other computing systems or integrated circuits) coupled to computer system 900 via a network. In one embodiment, input/output circuits 904 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 904 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   an oscillator circuit coupled to a power supply node, wherein the oscillator circuit is configured to generate at least one oscillator signal; and
   a control circuit configured to perform a measurement operation, wherein to perform the measurement operation, the control circuit is configured to:
     reduce accumulated variation in a frequency of the at least one oscillator signal by enabling the oscillator circuit for a plurality of active time periods, and disabling the oscillator circuit during inactive time periods between successive active time periods of the plurality of active time periods;
     measure, during the plurality of active time periods, a number of cycles in the at least one oscillator signal to generate a plurality of uncorrelated cycle counts; and
   wherein the control circuit is further configured to, in response to a completion of the measurement operation:
     combine the plurality of uncorrelated cycle counts to generate a combined value; and
     generate, using the combined value, a result indicative of an operating condition associated with the oscillator circuit.

2. The apparatus of claim 1, wherein a change in a voltage level of the power supply node during a duration of the measurement operation is less than a threshold value.

3. The apparatus of claim 2, wherein the control circuit is further configured to:
   generate a plurality of phase signals, and wherein the control circuit is further configured to, during a given active time period of the plurality of active time periods, measure respective numbers of cycles of the plurality of phase signals; and
   store the respective numbers of cycles of the plurality of phase signals for the given active time period in an accumulator circuit.

4. The apparatus of claim 3, wherein the control circuit is further configured to:
   retrieve the respective numbers of cycles of the plurality of phase signals from the accumulator circuit; and combine retrieved versions of the respective numbers of cycles to generate the result.

5. The apparatus of claim 4, wherein to combine the retrieved versions, the control circuit is further configured to calculate an accumulated value of the retrieved versions.

6. The apparatus of claim 5, wherein the control circuit is further configured to calculate a temperature using the accumulated value of the retrieved versions.

7. A method, comprising:
generating an oscillator signal by an oscillator circuit included in a computer system;
performing a measurement operation including:
sampling a frequency of the oscillator signal during a plurality of time periods to generate a plurality of uncorrelated frequency samples;
reducing accumulated variation in the frequency of the oscillator signal by disabling the oscillator circuit between successive ones of the plurality of time periods; and
in response to completing the measurement operation:
combining the plurality of uncorrelated frequency samples to generate a combined value; and
determining an operating condition of the oscillator circuit using the combined value.

8. The method of claim 7, wherein the oscillator circuit is coupled to a power supply node, and wherein a change in a voltage level of the power supply node during a duration of the measurement operation is less than a threshold value.

9. The method of claim 8, wherein sampling the frequency of the oscillator signal includes counting a number of cycles included in the oscillator signal during a given time period of the plurality of time periods, and further comprising:
storing the number of cycles in response to determining that the given time period has elapsed; and
stopping a count associated with the number of cycles prior to a start of a different time period subsequent to the given time period.

10. The method of claim 9, wherein combining the plurality of uncorrelated frequency samples includes combining at least a first number of cycles measured during a first time period and a second number of cycles measured during a second time period of the plurality of time periods.

11. The method of claim 10, wherein combining the first number of cycles and the second number of cycles includes accumulating the first number of cycles and the second number of cycles.

12. The method of claim 7, wherein determining the operating condition of the oscillator circuit includes determining a temperature of the oscillator circuit.

13. The method of claim 7, wherein determining the operating condition of the oscillator circuit includes determining a voltage level of a power supply node coupled to the oscillator circuit.

14. An apparatus, comprising:
a controller circuit; and
a plurality of sensor circuits coupled together and to the controller circuit in a daisy chain fashion via a communication bus, wherein a given sensor circuit of the plurality of sensor circuits is configured to:
generate an oscillator signal;
perform a measurement operation, wherein the given sensor circuit is further configured to:
sample a frequency of the oscillator signal during a plurality of time periods to generate a plurality of uncorrelated frequency samples;
reduce accumulated variation in the frequency of the oscillator signal by disabling the generation of the oscillator signal between ones of the plurality of time periods; and
in response to a completion of the measurement operation:
combine the plurality of uncorrelated frequency samples to generate a combined value; and
determine an operating condition using the combined value; and
wherein the controller circuit is configured to adjust an operating parameter of a functional circuit block using the operating condition.

15. The apparatus of claim 14, wherein a duration of the measurement operation is less than a transition time between changes in power state.

16. The apparatus of claim 14, wherein the given sensor circuit is further configured to send data indicative of the operating condition to the controller circuit using the communication bus, and wherein to sample the frequency of the oscillator signal, the given sensor circuit is further configured to count a number of cycles included in the oscillator signal during a given time period of the plurality of time periods.

17. The apparatus of claim 16, wherein to combine the plurality of uncorrelated frequency samples, the given sensor circuit is further configured to generate an average of the number of cycles.

18. The apparatus of claim 14, wherein the given sensor circuit is further configured to accumulate respective pluralities of uncorrelated frequency samples over the plurality of time periods.

19. The apparatus of claim 14, wherein to determine the operating condition, the given sensor circuit is further configured to determine a voltage level of a power supply node coupled to the given sensor circuit.

20. The apparatus of claim 14, wherein to determine the operating condition, the given sensor circuit is further configured to determine a temperature.

* * * * *